United States Patent
Furui et al.

(10) Patent No.: US 7,491,288 B2
(45) Date of Patent: Feb. 17, 2009

(54) METHOD OF CUTTING LAMINATE WITH LASER AND LAMINATE

(75) Inventors: Toshikazu Furui, Kawasaki (JP); Naohisa Matsushita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/968,139

(22) Filed: Oct. 20, 2004

(65) Prior Publication Data

US 2005/0269023 A1      Dec. 8, 2005

(30) Foreign Application Priority Data

Jun. 7, 2004   (JP) .............................. 2004-168312

(51) Int. Cl.
| | |
|---|---|
| B29C 65/16 | (2006.01) |
| B32B 37/18 | (2006.01) |
| B32B 38/04 | (2006.01) |
| B26D 3/08 | (2006.01) |
| B31B 1/25 | (2006.01) |
| H01L 21/301 | (2006.01) |
| B32B 38/18 | (2006.01) |
| B26D 3/10 | (2006.01) |
| H01L 21/304 | (2006.01) |

(52) U.S. Cl. ...................... 156/272.8; 156/250; 83/875; 83/879; 83/880; 438/113; 438/458; 438/460; 438/462; 438/463; 438/464

(58) Field of Classification Search ................. 156/250, 156/272.8; 83/875–887; 438/113, 458, 460, 438/462, 463, 464

See application file for complete search history.

(56) References Cited

U.S. PATENT DOCUMENTS

| | | | |
|---|---|---|---|
| 5,251,142 A | 10/1993 | Cramer | |
| 5,963,289 A * | 10/1999 | Stefanov et al. | 349/187 |
| 6,271,102 B1 * | 8/2001 | Brouillette et al. | 438/462 |
| 6,472,295 B1 * | 10/2002 | Morris et al. | 438/463 |
| 6,476,415 B1 * | 11/2002 | Walker et al. | 257/59 |
| 6,671,940 B2 | 1/2004 | Ishii | |
| 7,129,114 B2 * | 10/2006 | Akram | 438/110 |
| 2001/0041387 A1 | 11/2001 | Tateiwa et al. | |
| 2003/0006221 A1 | 1/2003 | Hong et al. | |

(Continued)

FOREIGN PATENT DOCUMENTS

JP    11-195624    7/1999

(Continued)

OTHER PUBLICATIONS

German Office Action dated Oct. 27, 2005 of Application No. 10 2004 055 040.9-34.

(Continued)

*Primary Examiner*—Philip C Tucker
*Assistant Examiner*—Sonya Mazumdar
(74) *Attorney, Agent, or Firm*—Staas & Halsey LLP

(57) ABSTRACT

A device such as an MEMS device is fabricated by cutting a laminate of a semiconductor substrate and a glass substrate. Grooves are formed in the glass substrate, and the semiconductor substrate and the glass substrate are laminated together such that the groove faces the semiconductor substrate. The laminated substrates are irradiated with a laser along the groove from the side of the glass substrate to cut the laminate into elements.

9 Claims, 6 Drawing Sheets

U.S. PATENT DOCUMENTS

2003/0145624 A1* 8/2003 Luettgens et al. ............ 65/17.1
2004/0002199 A1* 1/2004 Fukuyo et al. .............. 438/460
2005/0202596 A1* 9/2005 Fukuyo et al. .............. 438/113

FOREIGN PATENT DOCUMENTS

JP 2002-331378 9/2002
JP 2003-37218 2/2003

OTHER PUBLICATIONS

U.S. Appl. No. 11/488,642, filed Jul. 19, 2006, Toshikazu Furui, Fujitsu Limited.
U.S. Appl. No. 11/488,823, filed Jul. 19, 2006, Toshikazu Furui, Fujitsu Limited.
U.S. Appl. No. 11/245,048, filed Oct. 7, 2005, Toshikazu Furui, Fujitsu Limited.

* cited by examiner

METHOD OF CUTTING LAMINATE WITH LASER AND LAMINATE

BACKGROUND OF THE INVENTION

1. Field of the Invention

The present invention relates to a method of cutting a laminate and a laminate and, in particular, it relates to a method of cutting a laminate formed of substrates of different types of materials.

2. Description of the Related Art

A device comprising a laminate including a plurality of substrates of different types of materials has recently been developed. Highly technical devices such as MEMS devices are configured as a laminate of a substrate formed of silicon, and a substrate of lithium tantalate ($LiTaO_3$), sapphire, or heat-resistant glass, etc, superposed together. In fabricating such a device, the laminate composed of a plurality of substrates of different types of materials is cut into separate devices (chips).

In a conventional method, a semiconductor wafer is cut into separate semiconductor chips by rotating a wheel containing diamond abrasive grains at high speed. The wheel containing the diamond abrasive grains can be used also for separating the laminate of a plurality of substrates formed of different types of materials into individual devices.

In fabricating a device having a fine mechanism such as a MEMS device, however, an attempt to separate the laminate into individual devices using the wheel containing diamond abrasive grains poses the problem that the contact between the wheel and the laminate at the time of cutting operation causes the laminate to vibrate and often damages the fine mechanism of the device.

In the case where a device having a fine mechanism such as a MEMS device is fabricated, therefore, some measure is required to prevent the vibration of the laminate, and a cutting method using the laser is one choice. In the cutting method using the laser, however, the material is required to absorb the laser light, and therefore the combinations of the lasers and the materials to be cut are limited.

In the case where the laminate including a plurality of substrates of different types of material is separated into individual devices, therefore, it is necessary to use a plurality of lasers having wavelengths suitable for a plurality of materials, respectively. Japanese Unexamined Patent Publication No. 2003-37218, for example, discloses a method of cutting a multilayer substrate with a dual laser irradiation, in which a first laser is focused on a first substrate, and a second laser is focused on a second substrate.

In the case where the laminate including a plurality of substrates of different types of material is separated into individual devices, therefore, as many laser oscillators as there are stacked substrates are required, thereby leading to the problem of an expensive, bulky dicing apparatus.

For cutting a laminate formed of silicon having the thickness of several hundred μm and pyrex glass having the thickness of several hundred μm, such as a MEMS device recently developed, a YAG laser (laser wavelength λ of 1.064 μm) can be used as a laser capable of culling the silicon efficiently. As a laser capable of cutting glass, on the other hand, an ultraviolet laser (laser wavelength λ of 0.35 μm) typically including the excimer laser and the THG-YAG laser or an infrared laser (laser wavelength λ of 5 μm or more) typically including the $CO_2$ laser are available. The ultraviolet laser, however, requires a long time for cutting, and for example, several hours or longer to cut one line of 100 mm. The use of the infrared laser, on the other hand, results in the laser irradiation width of at least 1 mm in the cutting operation, and adversely affects the internal circuits in an application to a small device.

SUMMARY OF THE INVENTION

The object of the present invention is to provide a method of cutting a laminate comprising a plurality of substrates formed of different types of materials at low cost with high quality, and a laminate therefor.

According to the present invention, a method of cutting a laminate comprising a first substrate and a second substrate, comprises the steps of forming at least one groove on one of the first substrate and the second substrate, laminating the one substrate having the at least one groove on the other substrate such that the at least one groove faces the other substrate, and irradiating a laser beam onto the first and second substrates along the at least one groove from the side of the one substrate having the at least one groove.

Also, in a laminate according to the present invention, a first plate member of semiconductor and a second plate member of glass are superposed one on the other, and the second plate member has at least one groove on the side thereof facing the first plate member.

With this configuration, the laminate comprising first and second substrates can be positively cut using a single laser.

The laminate comprising a plurality of substrates of different materials can be cut at a time by the irradiation of a single laser and, therefore, a high-quality device can be produced efficiently. Thus, the dicing apparatus including a single laser is reduced in size and cost.

DESCRIPTION OF THE PREFERRED EMBODIMENTS

Figure 1A:
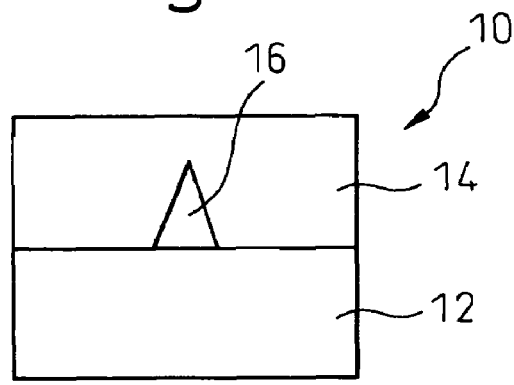
FIGS. 1A to 1C are diagrams showing a method of cutting a laminate according to the present invention.
Figure 1B:
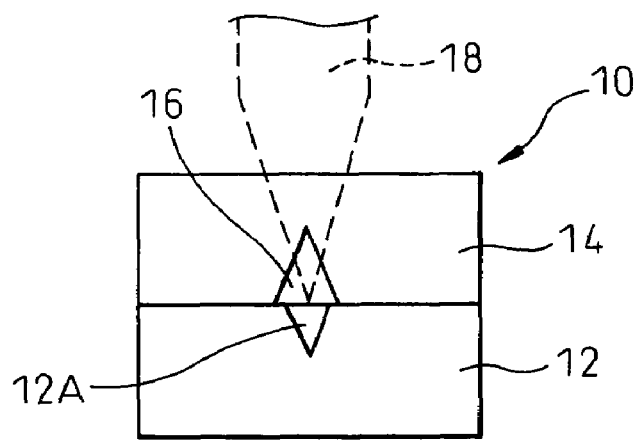
Figure 1C:
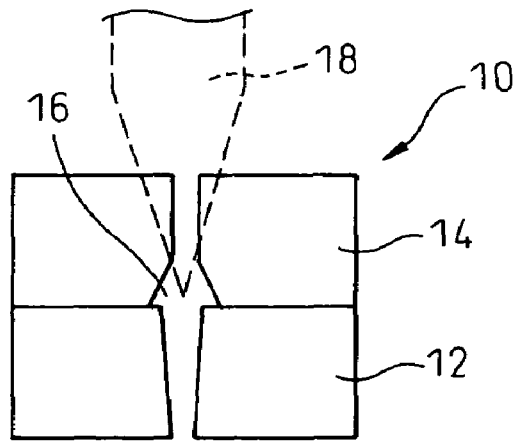

The preferred embodiments of the present invention are described below with reference to the drawings. FIGS. 1A to 1C are diagrams showing a method of cutting a laminate according to the present invention.

In FIG. 1A, a laminate 10 comprising a first substrate 12 and a second substrate 14 is prepared. The second substrate 14 has a groove 16. An explanation is made below with reference to an example in which a plurality of MEMS devices are fabricated, but the present invention is not limited to this example. The laminate 10 has circuits and fine mechanisms formed therein corresponding to a plurality of MEMS devices, and cut into individual MEMS devices separated from each other. The groove 16 is formed along a cutting line for separating the laminate into MEMS devices.

The first substrate 12 is formed of a semiconductor, i.e. constitutes a silicon wafer formed with circuits and fine mechanisms. The second substrate 14 is formed of pyrex glass, and the groove 16 is formed in the second substrate 14. The substrate 14 formed with the groove 16 is superposed on the first substrate 12 such that the groove 16 faces the first substrate 12.

In the embodiment, the first substrate 12 is formed of silicon and the second substrate 14 is formed of glass, but the first substrate 12 and the second substrate 14 are not limited to these materials, but other materials may be used. The first substrate 12 is formed of a material capable of absorbing the laser and the second substrate 14 is formed of a material which transmits the laser. The groove 16 is formed in the substrate made of a material which transmits the laser.

The first substrate 12 and the second substrate 14 are junctioned or bonded to each other. The first substrate 12 and the second substrate 14 are preferably bonded to each other by an anode junction.

In FIG. 1B, a laser 18 is irradiated onto the first substrate 12 and the second substrate 14 along the groove 16 from the side of the second substrate 14 remote from the groove 16. The laser is first transmitted through the second substrate 14 and then irradiates onto the first substrate 12. The first substrate 12 absorbs the laser, and the surface portion 12A of the first substrate 12 is melted or evaporated. In this way, the first substrate 12 begins to be cut.

As shown in FIG. 1C, the silicon particles of the melted or evaporated portion 12A of the first substrate 12 are scattered and directed toward the inner surface of the groove 16 of the second substrate 14. As a result, the second substrate 14 is cut at the position of the groove 16. Also, the surface portion 12A of the first substrate 12 continues to be melted until the first substrate 12 is cut through. Thus, the laminate 10 including the first substrate 12 and the second substrate 14 is cut into separate individual MEMS devices.

Figure 2:
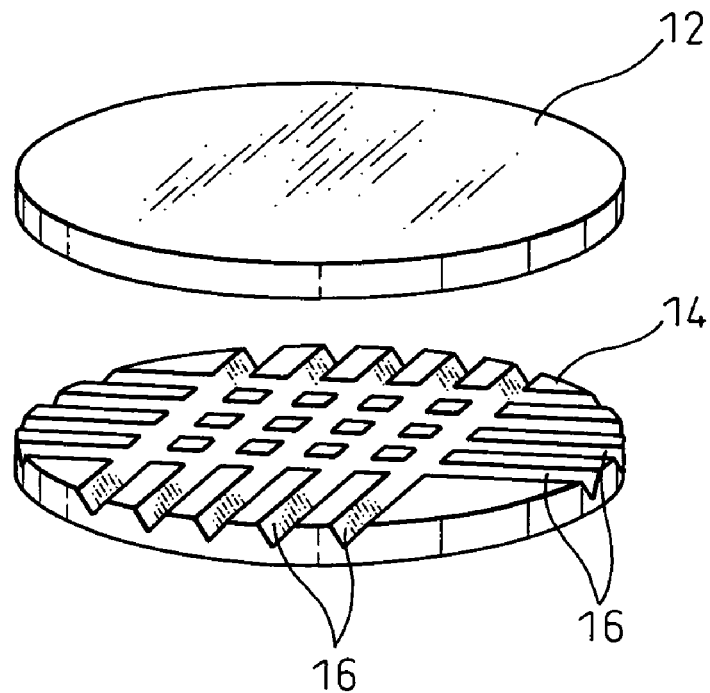
FIG. 2 is a perspective view showing a first substrate and a second substrate before being laminated together.

FIG. 2 is a perspective view showing the first substrate 12 and the second substrate 14 before being laminated together. A plurality of grooves 16 are formed in parallel to each other in each of two orthogonal directions on the surface of the second substrate 14. The grooves 16 are formed along the cutting lines for separating the laminate 10 into individual MEMS devices. In this embodiment, the first substrate 12 is formed of a silicon wafer having the diameter of 4 inches and the thickness of 500 μm. The second substrate 14 is formed of an anode juncture glass having the diameter of 4 inches and the thickness of 400 μm. The depth of the grooves 16 is 200 μm.

Figure 3:
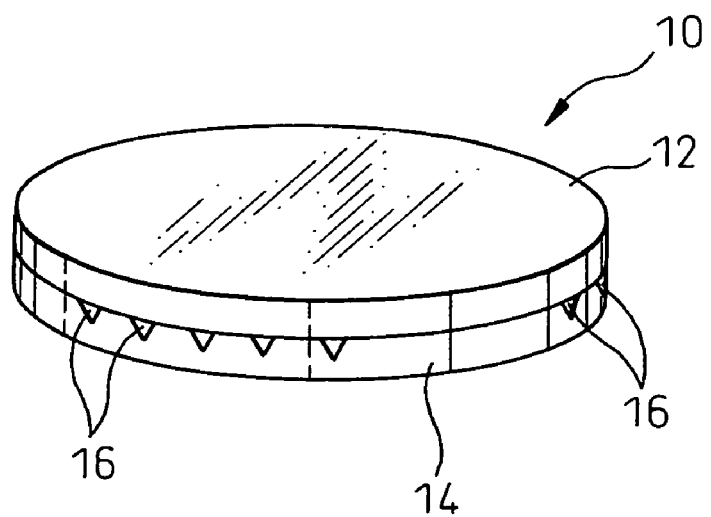
FIG. 3 is a perspective view showing a laminate comprising the first substrate and the second substrate.
Figure 4:
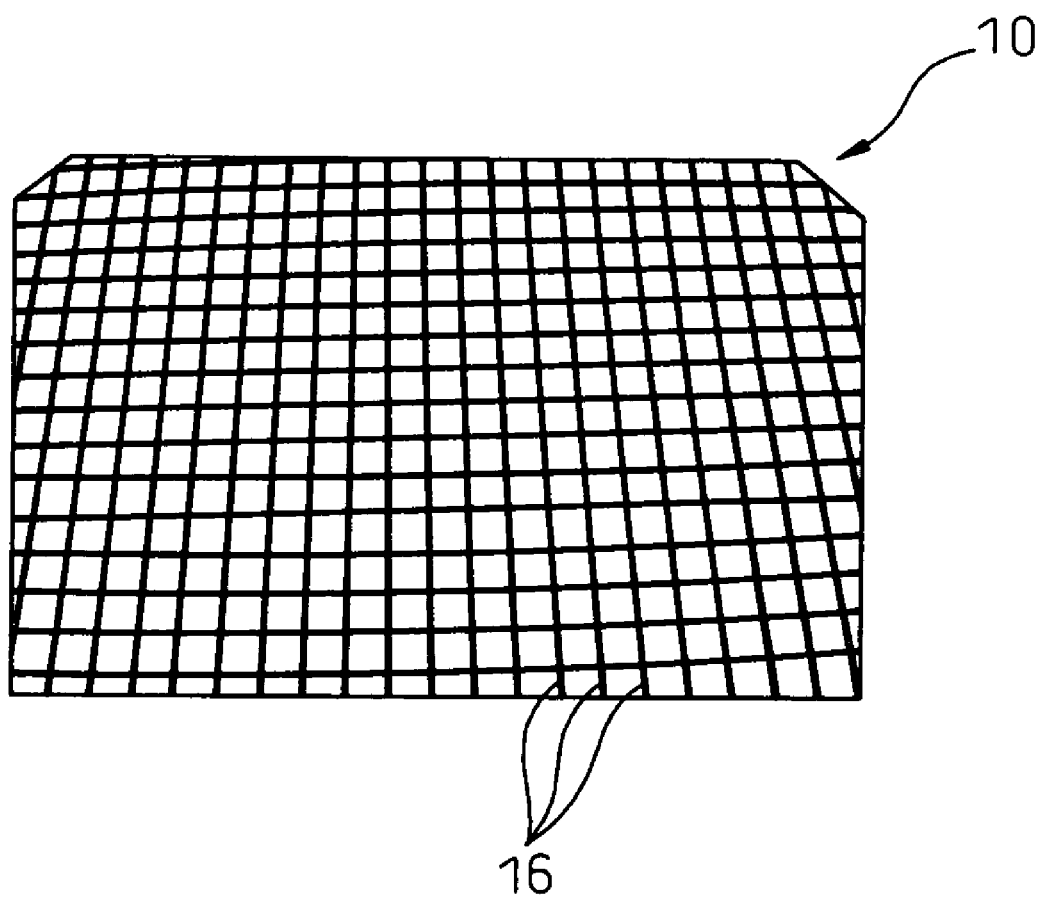
FIG. 4 is a top perspective view of a part of the laminate, as seen from the second substrate side.

FIG. 3 is a perspective view showing the laminate 10 including the first substrate 12 and the second substrate 14. The second substrate 14 is superposed on and joined to the first substrate 12 such that the grooves 16 face the first substrate 12. The grooves 16 are located in the joining surface between the first substrate 12 and the second substrate 14. FIG. 4 is a top perspective view of a part of the laminate 10, seen from the second substrate 14 side.

Figure 5:
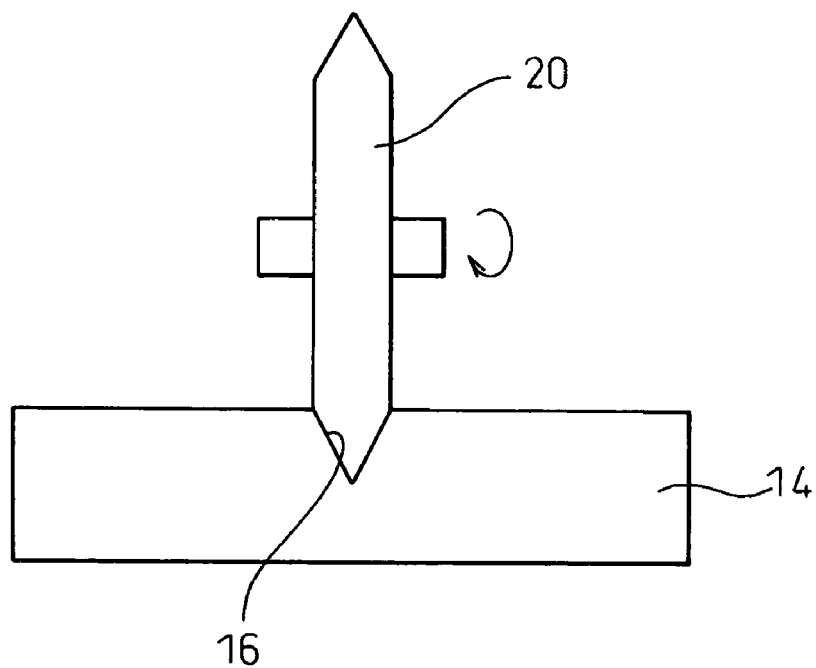
FIG. 5 is a diagram showing an example in which a groove is formed in the second substrate.

FIG. 5 is a diagram showing an example in which the groove 16 is formed in the second substrate 14. The groove 16 is formed in the surface of the second substrate 14 using a wheel 20 containing diamond abrasive grains. The wheel 20 is rotated in the direction as indicated by arrow, and moved relative to the second substrate 14 along the cutting line. The wheel 20 preferably has a peripheral cutting edge having a V-shaped cross section, so that the groove 16 is formed to have a V-shaped cross section.

Figure 6:
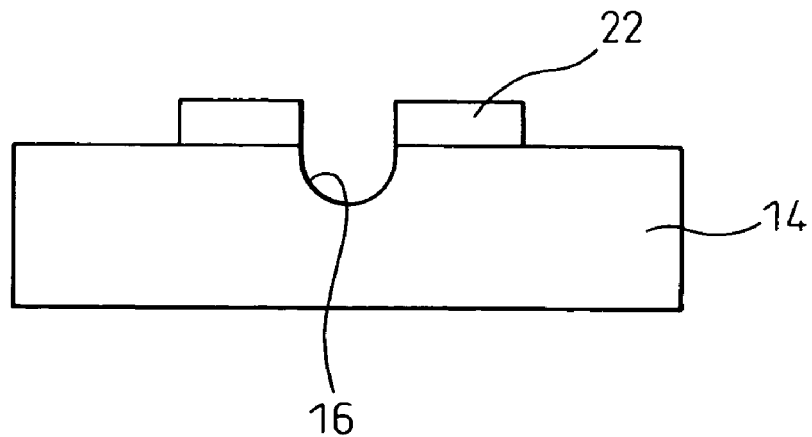
FIG. 6 is a diagram showing another example in which a groove is formed in the second substrate.

FIG. 6 is a diagram showing another example of forming a groove 16 in the second substrate 14. The groove 16 is formed in the surface of the second substrate 14 by etching with a mask 22. The groove 16 is preferably but not necessarily formed to have a V-shaped cross section. This is also the case with the example shown in FIG. 5.

Figure 7:
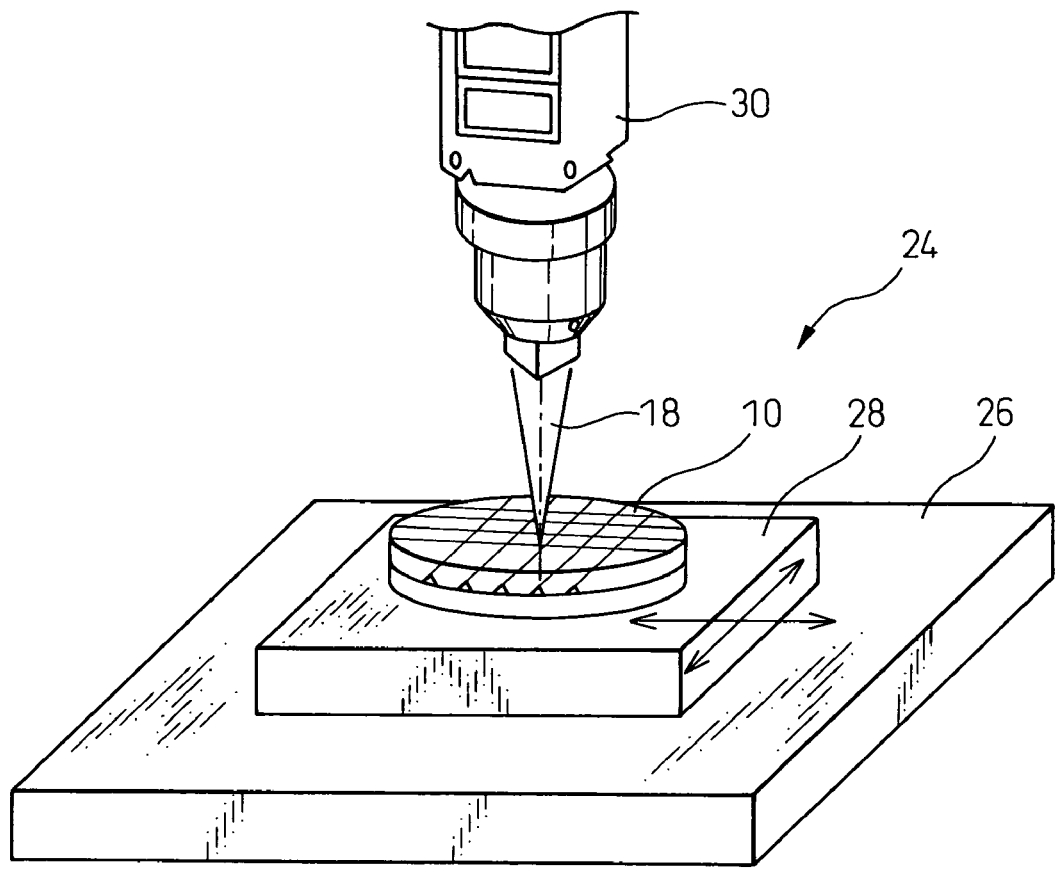
FIG. 7 is a perspective view showing a dicing apparatus for irradiating a laser onto the laminate.
Figure 8:
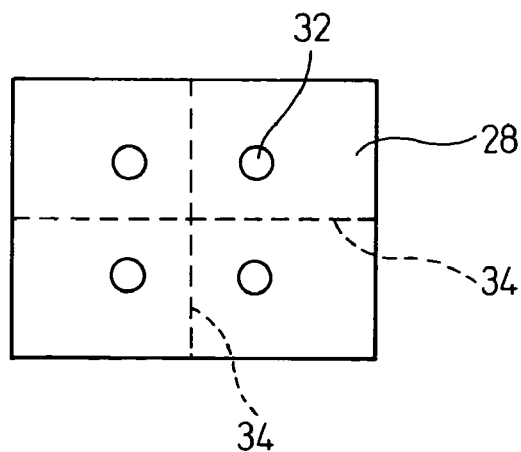
FIG. 8 is a plan view showing a part of the stage shown in FIG. 7.

FIG. 7 is a perspective view showing a dicing apparatus for irradiating the laser onto the laminate 16. FIG. 8 is a plan view showing a part of the stage of FIG. 7. The dicing apparatus 24 includes a base 26, an XY stage 28 arranged on the base 26 to mount the laminate 10 thereon, and a laser head 30 for irradiating the laser 18 toward the laminate 10 mounted on the XY stage 28. The XY stage 28 is movable in X and Y directions orthogonal to each other as indicated by arrows.

The XY stage 28 has a plurality of vacuum attraction holes 32, and the laminate 10 is held on the XY stage 28 by the vacuum introduced in the vacuum attraction holes 32. The vacuum attraction holes 32 are formed at positions displaced from the cutting lines 34 of the laminate 10, so that even after the laminate 10 is separated into individual MEMS devices, the individual MEMS devices are held on the XY stage 28 by the vacuum introduced in the vacuum attraction holes 32.

Figure 9:
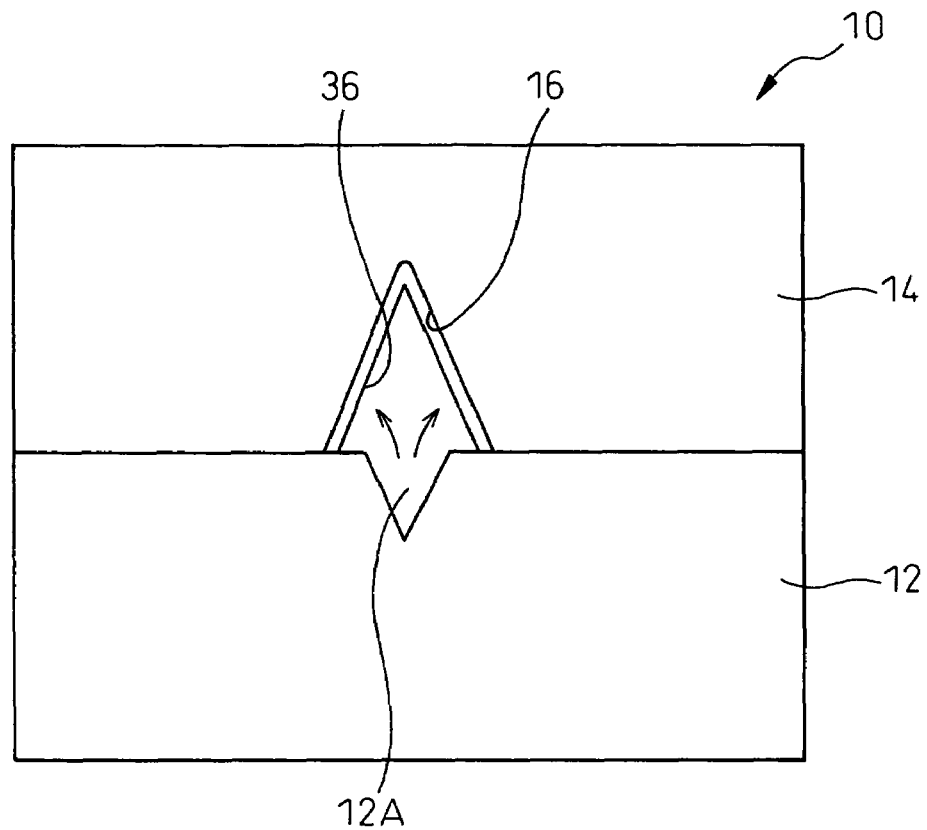
FIG. 9 is an enlarged sectional view showing the laminate upon the laser irradiation.

FIG. 9 is an enlarged sectional view showing the laminate 10 with the laser irradiated thereonto. FIG. 9 is similar to FIG. 1B. In FIG. 9, the first substrate 12 and the second substrate 14 are irradiated with the laser 18 along the groove 16 from the direction of the second substrate 14 having the groove 16. The laser is first transmitted through the second substrate 14 and irradiated onto the first substrate 12. The first substrate 12 absorbs the laser and the surface portion 12A of the first substrate 12 is melted or evaporated. The first substrate 12 begins to be cut in this way.

The silicon particles of the melted or evaporated portion 12A of the first substrate 12 blow out or fly out and, as indicated by arrows, move toward the inner surface of the groove 16 of the second substrate 14, and are adhered to the inner surface of the groove 16 of the second substrate 14 to form a film 36. The laser 18 is transmitted through the second substrate 14, but the film 36 adhered to the inner surface of the groove 16 of the second substrate 14 absorbs the laser. As a result, the temperature of the film 36 rises, and so does the temperature of the inner surface of the groove 16 of the second substrate 14 in contact with the film 36, thereby imposing stress on the inner surface of the groove 16. As a result, the second substrate 14 is cut at the position of the groove 16. Also, the surface portion 12A of the first substrate 12 continues to be melted and evaporated, until the substrate 12 is completely cut through. In this way, the laminate 10 including the first substrate 12 and the second substrate 14 is separated into individual MEMS devices. To facilitate understanding, the film 36 is shown to have a uniform thickness, but the film 36 is not necessarily uniform in thickness nor continuously formed.

As the groove 16 is provided, the silicon particles of the melted or evaporated portion 12A of the first substrate 12 can fly toward the inner surface of the groove 16 of the second substrate 14. In the absence of the groove 16, on the other hand, there is no escape space for the melted and blown-out silicon particles, and the silicon-glass junctured surfaces in the neighborhood of the portion 12A develops a very large stress, often resulting in an undesirable defect such as interface exfoliation or microcracks in the material. The provision of the groove 16 can prevent these defects.

Figure 10:
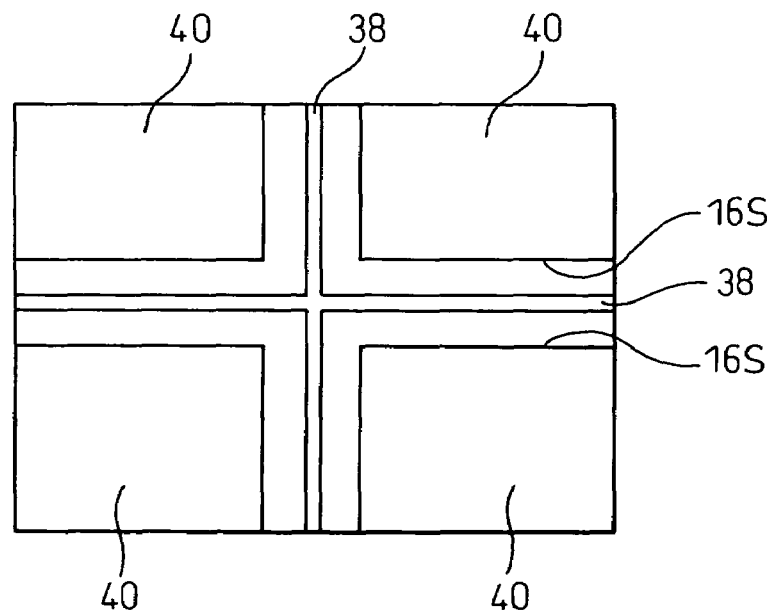
FIG. 10 is a plan view showing a part of the laminate cut by the laser irradiation.

FIG. 10 is a plan view showing a part of the laminate 10 cut by laser irradiation. Numeral 16S designates the side edges of the opening of the groove 16, and numeral 38 designates a portion cut by laser irradiation. The laminate 10 is separated into individual MEMS devices (chips) 40 along the cut portion 38.

In the preferred embodiment, a pulse YAG laser (laser wavelength λ of 1064 nm) is used as the laser 18 which is irradiated onto the laminate 10 mounted on the XY stage 28 from the side of the second substrate 14. The laser 18 having the pulse width of 0.1 ms is irradiated at a pulse repetition rate of 300 pulses per sec, a pulse energy of 40 mJ per pulse and a feed rate 120 mm per minute of the XY stage 28. In the process, the laser 18 is regulated to be focused at about the junction surface between the first substrate 12 and the second substrate 14. As a result, as shown in FIG. 10, both the first substrate 12 and the second substrate 14 are cut in a satisfactory fashion or in a positive way. The high feed rate 120 mm per minute of the XY stage 28 makes it possible to cut the laminate 10.

It will thus be understood, from the foregoing description, that according to the present invention, the use of a laser (such as YAG laser) capable of processing one type of material makes it possible to easily cut the laminate including two or more types of material. Thus, the dicing apparatus can be simplified and reduced in cost. Also, the provision of a groove in the material juncture surfaces along the cutting line prevents the separation of the material juncture surfaces at the time of cutting, thereby preventing the device from being damaged.

The invention claimed is:

1. A method of cutting a laminate comprising a first substrate and a second substrate, having first and second, opposite surfaces, comprising:
    forming at least one groove in the first surface of the second substrate;
    laminating said first substrate and the second substrate together, as a laminate, such that said at least one groove faces said first substrate; and
    irradiating a laser beam onto the second surface of the second substrate along said at least one groove, said laser beam being transmitted through said second substrate and absorbed by said first substrate, to cut the laminate.

2. The method according to claim 1, wherein said second substrate is formed of a glass and said first substrate is formed of a semiconductor.

3. The method according to claim 1, wherein said first substrate and said second substrate are joined to each other.

4. A method of cutting a laminate comprising a first substrate having a first surface and a second substrate having first and second, opposite surfaces, comprising:
    forming at least one groove in the first surface of the second substrate;
    laminating the first substrate and the second substrate together, as a laminate, such that the first surface of the second substrate faces the first surface of the first substrate; and
    irradiating a laser beam onto the laminate from the second surface of the second substrate and along the at least one groove, said laser beam being transmitted through said second substrate and absorbed by said first substrate, to cut the laminate.

5. The method according to claim 4, further comprising, irradiating the laser beam through the groove of the second substrate onto the surface of the first substrate.

6. A method of cutting a laminate comprising a first substrate and a transparent, second substrate, comprising:
    irradiating a laser beam, having a wavelength suitable for cutting material of the first substrate, but not suitable for cutting material of the second substrate, onto the laminate from the second substrate side of the laminate;
    wherein a groove is formed on a first surface of the second substrate, and the first and second substrates are laminated such that the first surface of the second substrate faces the first substrate; and
    irradiating the laser beam onto the laminate toward and along the groove, said laser beam being transmitted through said second substrate and absorbed by said first substrate.

7. The method according to claim 6, further comprising irradiating the laser beam through the groove of the second substrate onto the first substrate.

8. The method according to claim 7, further comprising:
    irradiating the laser beam so as to heat the first substrate and cause material thereof to travel to and collect on the inner surface of the groove and to be further heated by the laser beam passing through the second substrate along the groove, to produce stress on the inner surface of the groove and to cut the second substrate along the groove.

9. A method of cutting a laminate comprising a transparent, second substrate having a first surface having a groove therein and laminated to a surface of a first substrate, comprising:
    irradiating a laser beam through the second surface of the second substrate and through and along the groove onto the surface of the first substrate said laser beam being transmitted through said second substrate and absorbed by said first substrate, so as to heat and thereby cut the first substrate, causing particles of the first substrate to travel to and collect on the inner surface of the groove of the second substrate; and
    heating the collected particles by irradiating same with the laser beam passing through the second substrate and along the groove, to stress the second substrate and thereby cut the laminate.

* * * * *

UNITED STATES PATENT AND TRADEMARK OFFICE
CERTIFICATE OF CORRECTION

PATENT NO. : 7,491,288 B2
APPLICATION NO. : 10/968139
DATED : February 17, 2009
INVENTOR(S) : Toshikazu Furui et al.

It is certified that error appears in the above-identified patent and that said Letters Patent is hereby corrected as shown below:

Column 6, Line 10, change "comprising," to --comprising:--.

Signed and Sealed this

Twenty-eighth Day of April, 2009

JOHN DOLL
*Acting Director of the United States Patent and Trademark Office*